(12) United States Patent
Tada et al.

(10) Patent No.: US 12,721,188 B2
(45) Date of Patent: Aug. 25, 2026

(54) SEMICONDUCTOR DEVICE

(71) Applicant: FUJI ELECTRIC CO., LTD., Kawasaki (JP)

(72) Inventors: Shinji Tada, Matsumoto-city (JP); Yuma Murata, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 751 days.

(21) Appl. No.: 17/975,444

(22) Filed: Oct. 27, 2022

(65) Prior Publication Data

US 2023/0187323 A1 Jun. 15, 2023

(30) Foreign Application Priority Data

Dec. 10, 2021 (JP) ................................ 2021-200513

(51) Int. Cl.

| | |
|---|---|
| ***H10W 76/138*** | (2026.01) |
| ***H10W 20/48*** | (2026.01) |
| ***H10W 70/20*** | (2026.01) |
| ***H10W 70/40*** | (2026.01) |
| ***H10W 76/12*** | (2026.01) |

(Continued)

(52) U.S. Cl.

CPC ......... *H10W 70/442* (2026.01); *H10W 70/20* (2026.01); *H10W 76/12* (2026.01); *H10W 76/17* (2026.01); *H10W 72/926* (2026.01); *H10W 80/721* (2026.01)

(58) Field of Classification Search

CPC ... H01L 23/49537; H01L 23/04; H01L 23/06; H01L 23/492; H01L 24/09; H01L 2224/0903; H01L 23/051; H01L 23/29; H01L 23/3157; H01L 23/5329; H05K 7/1432; H01R 12/57

See application file for complete search history.

(56) References Cited

U.S. PATENT DOCUMENTS

| | | | | |
|---|---|---|---|---|
| 5,825,085 A | 10/1998 | Masumoto et al. | | |
| 2008/0112201 A1* | 5/2008 | Yahata | ................. | H02M 7/003 363/141 |

(Continued)

FOREIGN PATENT DOCUMENTS

| | | |
|---|---|---|
| CN | 211858189 U | 11/2020 |
| EP | 1921739 A2 | 5/2008 |

(Continued)

OTHER PUBLICATIONS

Japanese Patent Office Action issued for corresponding JP Patent Application No. 2021-200513 on Oct. 28, 2025.

*Primary Examiner* — Zandra V Smith
*Assistant Examiner* — Daniel J Hibbert
(74) *Attorney, Agent, or Firm* — Rabin & Berdo, P.C.

(57) ABSTRACT

A semiconductor device, including a case that has a first power terminal including a first bonding area and a second power terminal including a second bonding area, and an insulating unit located between the first power terminal and the second power terminal, and having a shape of a flat plate, the insulating unit being bonded to the case. The insulating unit has a first insulating portion in a sheet form, and a second insulating portion which covers an upper surface, a lower surface, or both the upper and lower surfaces, of the first insulating portion. The first bonding area and the second bonding area are exposed from the insulating unit and from the case.

14 Claims, 12 Drawing Sheets

(51) Int. Cl.

| | |
|---|---|
| ***H10W 76/17*** | (2026.01) |
| *H01R 12/57* | (2011.01) |
| *H10W 72/90* | (2026.01) |
| *H10W 80/00* | (2026.01) |

(56) References Cited

U.S. PATENT DOCUMENTS

| | | | | |
|---|---|---|---|---|
| 2009/0002956 | A1 | 1/2009 | Suwa et al. | |
| 2015/0131232 | A1* | 5/2015 | Ishino .................. | H05K 7/2039<br>361/707 |
| 2019/0157221 | A1 | 5/2019 | Soyano et al. | |
| 2019/0295931 | A1* | 9/2019 | Kawabata ............... | H01L 24/49 |
| 2021/0202372 | A1 | 7/2021 | Kato et al. | |

FOREIGN PATENT DOCUMENTS

| | | | |
|---|---|---|---|
| JP | H09-69603 | A | 3/1997 |
| JP | 2000149667 | A | 5/2000 |
| JP | 2008-125240 | A | 5/2008 |
| JP | 2009005512 | A | 1/2009 |
| JP | 2021-106235 | A | 7/2021 |
| WO | 2018/142863 | A1 | 8/2018 |

* cited by examiner 1
20
20
20
22
30
21
11c
11d
11a
25
12c
12e
24
12b
12d
23
12a
11e
Y
Y
10
11
11f
11b
X
Y
Z 51
51a X
Z
Y
52
52a

X
Z
Y 1a
11d
11a
22
30
21
12c
12e
12b
22
30
21
12d
22
30
21
12a
25
24
23
11c
10a
11
11f
11b
Y
X
Z

SEMICONDUCTOR DEVICE

CROSS-REFERENCE TO RELATED APPLICATION

This application is based upon and claims the benefit of priority of the prior Japanese Patent Application No. 2021-200513, filed on Dec. 10, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices used as a power converter. The power devices include semiconductor chips such as insulated gate bipolar transistors (IGBTs) or power metal oxide semiconductor field effect transistors (MOSFETs). Such semiconductor devices include at least semiconductor chips, an insulated circuit board over which the semiconductor chips are arranged, and P-type and N-type connection terminals housed in a case. Connection is made from the outside to each P-type connection terminal or N-type connection terminal. In particular, the P-type and N-type connection terminals are integrally molded with the case (see, for example, International Publication Pamphlet No. WO 2018/142863). Furthermore, terminal portions of P-type and N-type electrode plates bent so as to have the shape of the letter "L" are arranged horizontally on the upper surface of a sheath case and bolts are fixed (see, for example, Japanese Laid-open Patent Publication No. H09-069603). At this time, insulation is kept between P-type and N-type connection terminals. Therefore, for example, an insulating member is put between these terminals (see, for example, Japanese Laid-open Patent Publication No. 2021-106235 or No. 2008-125240).

With a semiconductor device, for example, resin which is equal in quality to a case may be used as an insulating member between P-type and N-type connection terminals. In this case, in order to keep insulation between the P-type and N-type connection terminals, the insulating member needs a determined thickness. This leads to an increase in the size of the semiconductor device. Furthermore, if insulating paper is used as an insulating member, then an increase in the size of the semiconductor device is suppressed. However, insulating paper is difficult to handle and adhesion between insulating paper and resin used for forming the case is not good. For example, if insulating paper is put between the P-type and N-type connection terminals, then the insulating paper may bend. If insulating paper is put between the P-type and N-type connection terminals in a state in which it is bent, then it may be that insulation is not sufficiently kept between the P-type and N-type connection terminals.

SUMMARY OF THE INVENTION

According to an aspect, there is provided a semiconductor device including: a case having a first power terminal including a first bonding area, and a second power terminal including a second bonding area; and an insulating unit located between the first power terminal and the second power terminal, and having a shape of a flat plate, the insulating unit being bonded to the case, wherein the insulating unit has a first insulating portion in a sheet form, and a second insulating portion which covers an upper surface, a lower surface, or both the upper and lower surfaces, of the first insulating portion, the first bonding area and the second bonding area are exposed from the insulating unit and from the case.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
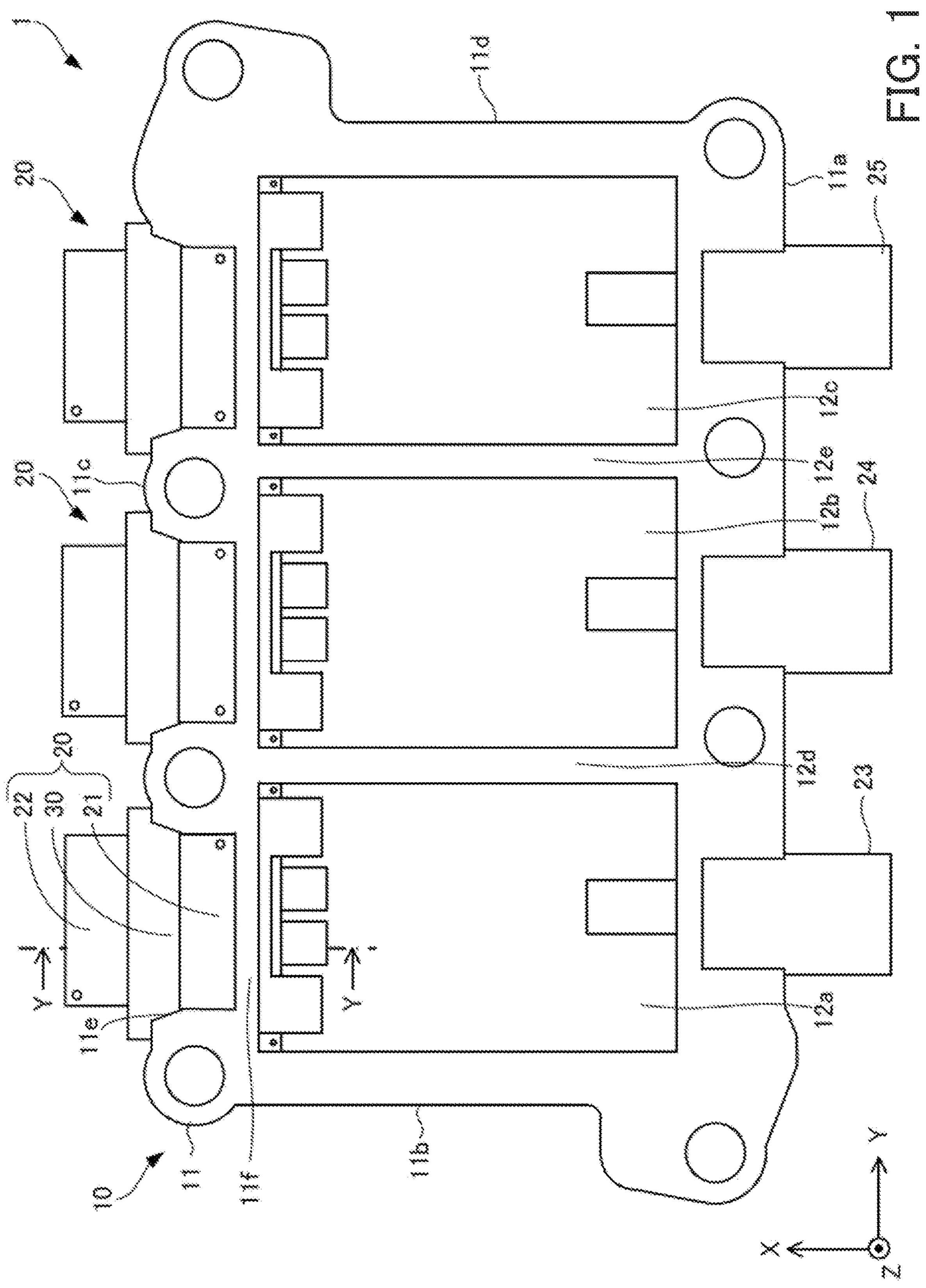
FIG. 1 is a plan view of a semiconductor device according to a first embodiment.

Embodiments will now be described with reference to the accompanying drawings. In the embodiments, a "front surface (upper part)" indicates a surface (direction) of a semiconductor device 1 (case 10) of FIG. 1 which faces the upper side. FIG. 1 illustrates the front surface and the sides of the semiconductor device 1. For example, a sealing surface of a sealing member which seals housing portions 12*a*, 12*b*, and 12*c* of the case 10 is the front surface (upper part). A "back surface (lower part)" indicates a surface (direction) of the semiconductor device 1 of FIG. 1 which faces the lower side. For example, a surface of the case 10 on which a radiation plate is located is the back surface (lower part). A "front surface (upper part)" or a "back surface (lower part)" means the same direction in the other drawings. For example, an "upside" or a "downside" does not always mean the vertical direction relative to the ground. That is to say, a direction indicated by the "upside" or the "downside" is not limited to the gravity direction. Furthermore, in the following description, a "main ingredient" indicates an ingredient contained at a rate of 80 volume percent (vol %) or more.

First Embodiment

Figure 2:
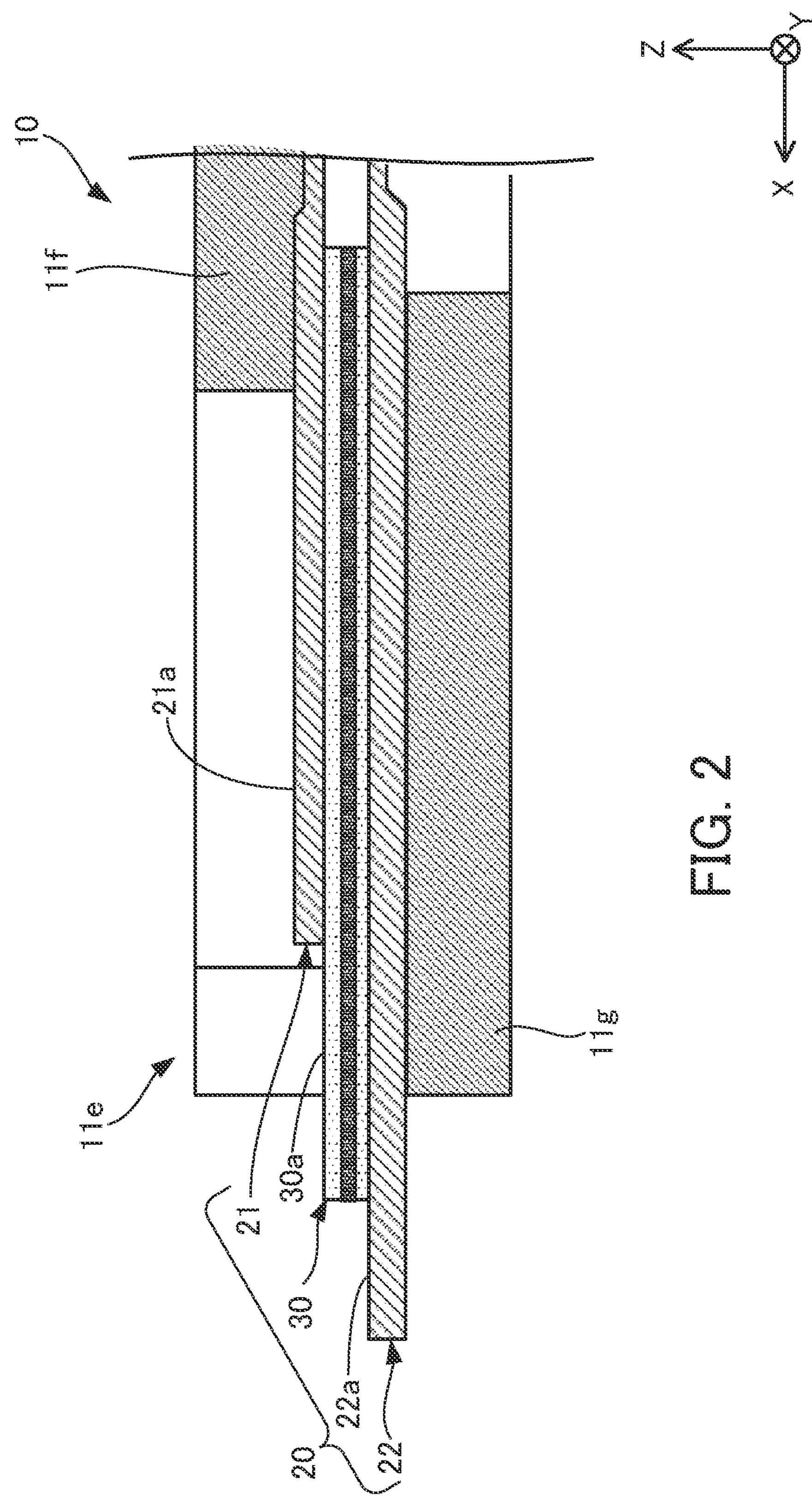
FIG. 2 is a sectional view of the semiconductor device according to the first embodiment.
Figure 3:
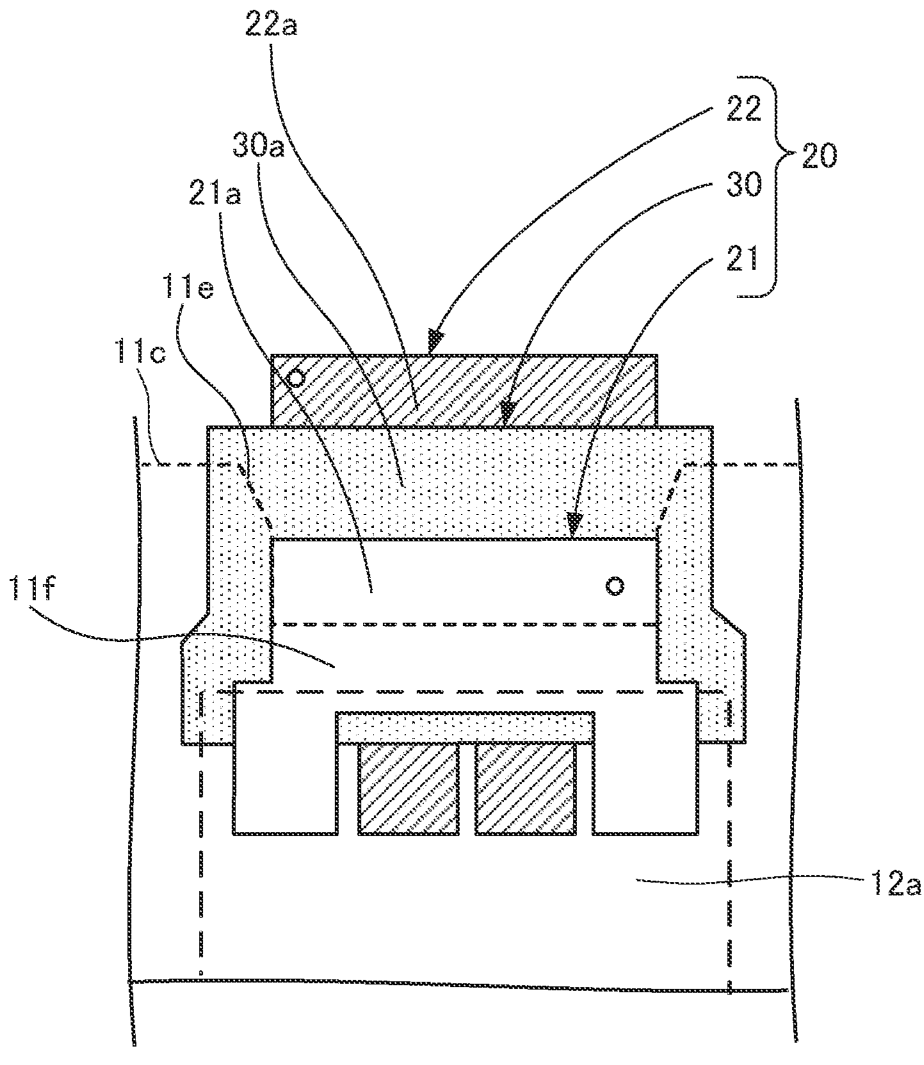
FIG. 3 is a plan view of the vicinities of a terminal portion included in the semiconductor device according to the first embodiment.
Figure 3:
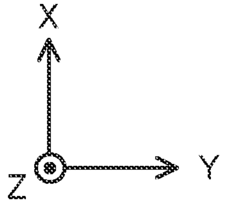
Figure 4:
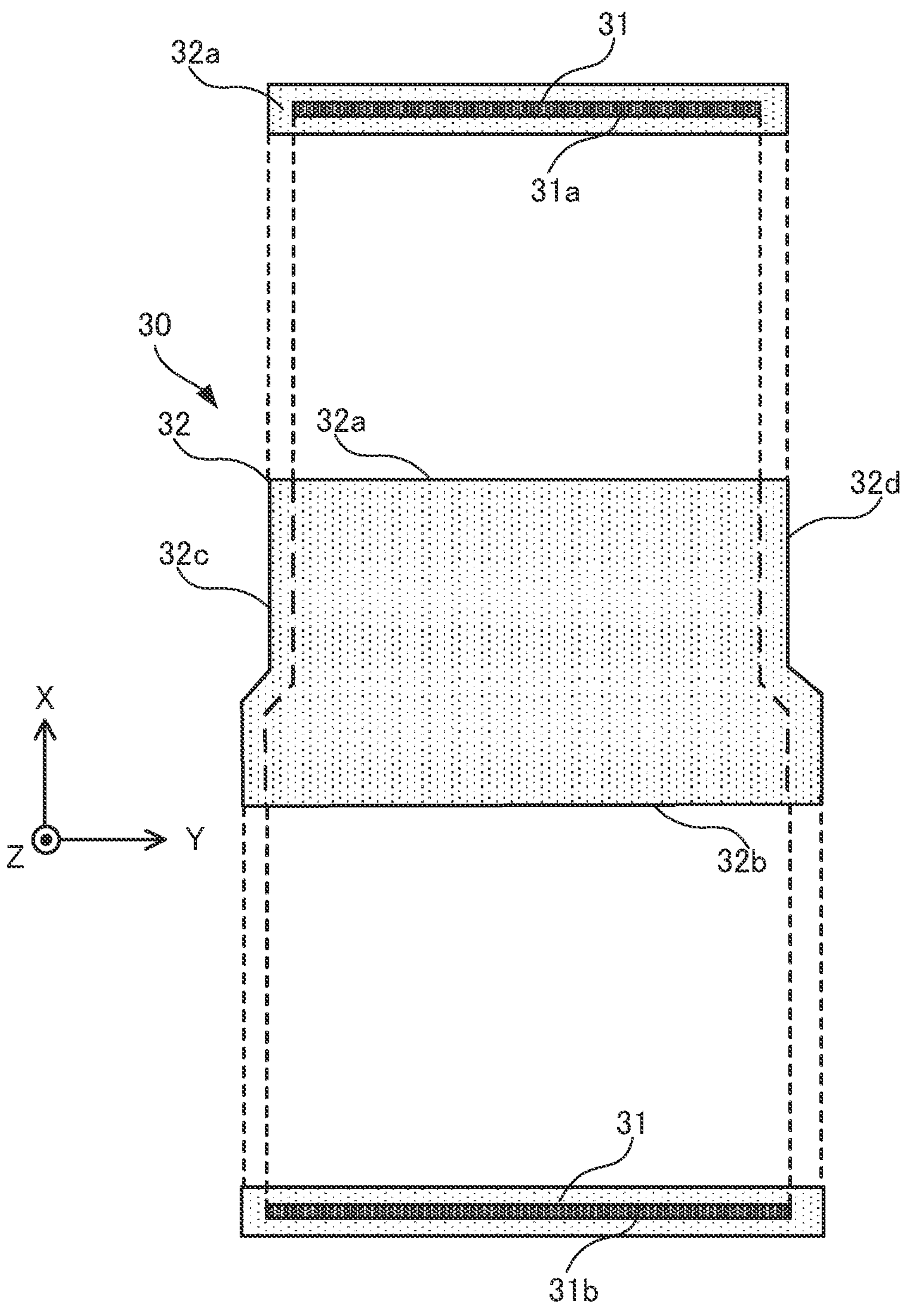
FIG. 4 illustrates an insulating unit included in the semiconductor device according to the first embodiment.

The semiconductor device 1 according to the first embodiment will be described with reference to FIGS. 1 through 4. FIG. 1 is a plan view of the semiconductor device according to the first embodiment. FIG. 2 is a sectional view of the semiconductor device according to the first embodiment. FIG. 3 is a plan view of the vicinities of a terminal portion included in the semiconductor device according to the first embodiment. FIG. 4 illustrates an insulating unit included in the semiconductor device according to the first embodiment. FIG. 1 omits a semiconductor unit and sealing resin from the semiconductor device 1. FIG. 2 is a sectional view taken along the dot-dash line Y-Y of FIG. 1. FIG. 3 is a plan view of a terminal portion 20 of the housing portion 12a and the case 10 is indicated by a dashed line. Each of the housing portions 12b and 12c has the same structure that is illustrated in FIG. 3. Furthermore, a plan view of an insulating unit 30 is indicated in the middle part of FIG. 4, an upper end surface (front end surface 32a) of the insulating unit 30 indicated in the middle part is indicated in the upper part of FIG. 4, and a lower end surface (back end surface 32b) of the insulating unit 30 indicated in the middle part is indicated in the lower part of FIG. 4.

The semiconductor device 1 includes semiconductor units (not illustrated) and the case 10 which houses the semiconductor units. Furthermore, the semiconductor device 1 may include a radiation plate (not illustrated) over which the semiconductor units are located and which is located on the back surface of the case 10.

The case 10 includes a frame portion 11, terminal portions 20, a U-phase output terminal 23, a V-phase output terminal 24, a W-phase output terminal 25, and control terminals (not illustrated). The frame portion 11 is approximately rectangular in plan view and is surrounded on all sides by a first side portion 11a through a fourth side portion 11d. The frame portion 11 includes the housing portions 12a, 12b, and 12c along the third side portion 11c. Three terminal opening portions 11e are formed in the third side portion 11c of the frame portion 11 along the third side portion 11c. The terminal opening portions 11e are opened and communicate with the housing portions 12a, 12b, and 12c. Furthermore, the terminal opening portions 11e spread in plan view toward the outside (in the +X direction). A terminal portion 20 is formed in each terminal opening portion 11e. The terminal portion 20 includes a second power terminal 22, an insulating unit 30, and a first power terminal 21.

The inside of the frame portion 11 of the case is partitioned in plan view into the housing portions 12a, 12b, and 12c with partition portions 12d and 12e. The housing portions 12a, 12b, and 12c are located in the longitudinal direction of the frame portion 11 (along the first side portion 11a and the third side portion 11c). A semiconductor unit is housed in each of the housing portions 12a, 12b, and 12c. The semiconductor unit is electrically connected to the first power terminal 21 and the second power terminal 22 in each of the housing portions 12a, 12b, and 12c. Furthermore, the semiconductor unit is electrically connected to the U-phase output terminal 23, the V-phase output terminal 24, and the W-phase output terminal 25 in each of the housing portions 12a, 12b, and 12c. In addition, the semiconductor unit is also connected electrically to the control terminals (not illustrated). The control terminals may be located in the partition portions 12d and 12e. Wiring members (such as bonding wires or lead frames) are used for these electrical connections. Such wiring members are made of a material having good electrical conductivity. Such a material is metal (such as aluminum or copper), an alloy containing at least one of them, or the like. The semiconductor unit is housed in this way in each of the housing portions 12a, 12b, and 12c and the inside of the housing portions 12a, 12b, and 12c is sealed with sealing resin.

A sealing member contains a thermosetting resin and a filler contained therein. Such a thermosetting resin is epoxy resin, phenolic resin, maleimide resin, or the like. Such a filler is silicon oxide, aluminum oxide, boron nitride, or aluminum nitride.

As illustrated in FIG. 2 and FIG. 3, the terminal portion 20 is formed by laminating the second power terminal 22, the insulating unit 30, and the first power terminal 21 in order. The terminal portion 20 is integrally molded with the frame portion 11. With the terminal portion 20, the front surfaces of a second bonding area 22a of the second power terminal 22, a terrace portion 30a of the insulating unit 30, and a first bonding area 21a of the first power terminal 21 are exposed from the terminal opening portion 11e of the third side portion 11c.

The second power terminal 22 has the shape of a flat plate. One end portion of the front surface of the second power terminal 22 is exposed from the terminal opening portion 11e of the third side portion 11c of the frame portion 11 in the longitudinal direction (along the third side portion 11c). The back surface of the second power terminal 22 is covered with a bottom portion 11g of the frame portion 11. In this case, one end portion (second bonding area 22a) of the second power terminal 22 protrudes outward (in the +X direction) from the third side portion 11c (and the bottom portion 11g of the frame portion 11). A positive electrode potential is connected from the outside to the second bonding area 22a. The other end portion of the second power terminal 22 is electrically connected to a main electrode of a semiconductor chip inside the housing portion 12a, 12b, or 12c of the frame portion 11. The second power terminal 22 is made of metal, such as copper or a copper alloy, having good electrical conductivity.

The insulating unit 30 has an insulating property and has the shape of a flat plate. As illustrated in FIG. 4, the shape of the insulating unit 30 is such that the width (in the +Y directions) between upper portions (in the +X direction) of both side end surfaces 32c and 32d in the +Y directions becomes narrower. The width (in the ŁY directions) of the insulating unit 30 is greater than that of the second power terminal 22 in plan view. Side portions in the #Y directions of the insulating unit 30 are covered with (adhere to) the frame portion 11. Furthermore, the insulating unit 30 protrudes outward (in the +X direction) from the third side portion 11c. There is a gap (second bonding area 22a of the second power terminal 22) between an end portion of the insulating unit 30 and an end portion of the second power terminal 22. In addition, the insulating unit 30 has the terrace portion 30a where the surface of the insulating unit 30 is exposed. The terrace portion 30a is situated between the first bonding area 21a of the first power terminal 21 and the second bonding area 22a of the second power terminal 22 as an insulating area. As a result, insulation between the first power terminal 21 and the second power terminal 22 is kept. The shape in plan view of the insulating unit 30 in this embodiment is an example. As long as the insulating unit 30 is put between the first power terminal 21 and the second power terminal 22 and insulation between the first power terminal 21 and the second power terminal 22 is kept, the shape of the insulating unit is not limited to that described in this embodiment.

Furthermore, the insulating unit 30 includes insulating paper 31 (first insulating portion) and a sealing portion 32 (second insulating portion). An adhesive member may be included between the insulating paper 31 and the sealing portion 32. FIG. 4 does not illustrate the adhesive member. As illustrated in FIG. 4, with the insulating unit 30, a front section 31*a* of the insulating paper 31 is flush with the front end surface 32*a* of the sealing portion 32 and is exposed. In addition, a back section 31*b* of the insulating paper 31 is flush with the back end surface 32*b* of the sealing portion 32 and is exposed. As described later, a portion of the insulating paper 31 protruding from the sealing portion 32 is cut in the process for manufacturing the insulating unit 30. The front section 31*a* and the back section 31*b* are formed at that time. For example, the insulating paper 31 is aramid paper. Aramid paper is insulating paper into which high-density aramid fibers are woven. The insulating paper 31 need only be a member in sheet form having an insulating property. The insulating paper 31 is not limited to paper. For example, the insulating paper 31 may be a film. The above insulating paper 31 is inserted into the sealing portion 32 to seal the insulating paper 31. That is to say, the sealing portion 32 covers the upper surface, the lower surface, and the sides of the insulating paper 31. In this embodiment, a case where the entire insulating paper 31 is covered with the sealing portion 32 is described. However, at least one of the upper surface and the lower surface of the insulating paper 31 may be covered with the sealing portion 32. Moreover, the sealing portion 32 contains a thermoplastic resin (second resin) as a main ingredient. Such a thermoplastic resin is polyphenylene sulfide (PPS) resin, polybutylene terephthalate (PBT) resin, polybutylene succinate (PBS) resin, polyamide (PA) resin, acrylonitrile butadiene styrene (ABS) resin, or the like. The details of the insulating unit 30 will be described later.

The first power terminal 21 has the shape of a flat plate. One end portion of the front surface of the first power terminal 21 is exposed from the terminal opening portion 11*e* of the third side portion 11*c* of the frame portion 11 in the longitudinal direction (along the third side portion 11*c*). The width (in the +Y directions) of a portion of the first power terminal 21 exposed from the terminal opening portion 11*e* is approximately equal to the width (in the +Y directions) of a portion of the second power terminal 22 exposed from the terminal opening portion 11*e*. The first power terminal 21 is located over the second power terminal 22 with the insulating unit 30 therebetween so that one end portion (first bonding area 21*a*) of the first power terminal 21 will be exposed. That is to say, the exposed portion of the first power terminal 21 on the side of the housing portion 12*a*, 12*b*, or 12*c* is covered with a beam portion 11*f* of the case 10. A negative electrode potential is connected from the outside to the first bonding area 21*a*. The other end portion of the first power terminal 21 is electrically connected to a main electrode of a semiconductor chip inside the housing portion 12*a*, 12*b*, or 12*c* of the frame portion 11. The first power terminal 21 is made of metal, such as copper or a copper alloy, having good electrical conductivity.

As illustrated in FIG. 3, with the terminal portion 20, the first bonding area 21*a* of the first power terminal 21 and the second bonding area 22*a* of the second power terminal 22 are a determined distance apart. As a result, creepage distance between the first power terminal 21 and the second power terminal 22 is kept. In this case, the creepage distance depends on a withstand voltage value of the semiconductor device 1. For example, the creepage distance is longer than or equal to 3 mm and shorter than or equal to 14.5 mm. Alternatively, the creepage distance may be longer than or equal to 6 mm and shorter than or equal to 12.5 mm. Furthermore, if a withstand voltage value of the semiconductor device 1 is 750 V, then the creepage distance may be obtained by adding a tolerance of 0.5 mm to 7.5 mm. If a withstand voltage value of the semiconductor device 1 is 1200 V, then the creepage distance may be obtained by adding a tolerance of 0.5 mm to 12 mm. In addition, the terrace portion 30*a* of the insulating unit 30 is situated within the creepage distance.

The other end portions of the U-phase output terminal 23, the V-phase output terminal 24, and the W-phase output terminal 25 are electrically connected to source electrodes (or emitter electrodes) of semiconductor chips of semiconductor units in the housing portions 12*a*, 12*b*, and 12*c*. One end portions of the U-phase output terminal 23, the V-phase output terminal 24, and the W-phase output terminal 25 are exposed from the first side portion 11*a* of the frame portion 11 in the longitudinal direction of the frame portion 11 (along the first side portion 11*a*). The U-phase output terminal 23, the V-phase output terminal 24, and the W-phase output terminal 25 are made of metal, such as copper or a copper alloy, having good electrical conductivity.

The other end portions of the first power terminal 21, the second power terminal 22, the U-phase output terminal 23, the V-phase output terminal 24, and the W-phase output terminal 25 are electrically connected to main electrodes, such as emitter electrodes (or source electrodes) or collector electrodes (or drain electrodes), of the semiconductor chips.

For example, one end portions of the control terminals may extend in the +Z direction from the partition portions 12*d* and 12*e*. The other end portions of the control terminals are electrically connected to gate electrodes (control electrodes) of the semiconductor chips of the semiconductor units in the housing portions 12*a*, 12*b*, and 12*c*. The control terminals are made of metal, such as copper, a copper alloy, aluminum, or an aluminum alloy, having good electrical conductivity.

The frame portion 11 of the case 10 includes the terminal portions 20, the U-phase output terminal 23, the V-phase output terminal 24, the W-phase output terminal 25, and the control terminals. They are integrally molded by injection molding by the use of a thermoplastic resin (first resin). Such a thermoplastic resin is polyphenylene sulfide resin, polybutylene terephthalate resin, polybutylene succinate resin, polyamide resin, acrylonitrile butadiene styrene resin, or the like. Resin used for forming the frame portion 11 may be different from resin used for forming the sealing portion 32 of the insulating unit 30. In this embodiment, PPS resin is used for forming the frame portion 11 and the sealing portion 32.

A semiconductor unit includes an insulated circuit board, semiconductor chips mounted over the insulated circuit board, and lead frames which electrically connect the semiconductor chips and the insulated circuit board. The insulated circuit board is rectangular in plan view. The insulated circuit board includes an insulating plate, a plurality of circuit patterns formed over the front surface of the insulating plate, and a metal plate formed on the back surface of the insulating plate. The insulating plate is made of a material having an insulating property, low thermal resistance, and high thermal conductivity. The insulating plate is made of a ceramic such as aluminum oxide, aluminum nitride, or silicon nitride. The plurality of circuit patterns are made of a material, such as copper, aluminum, or an alloy containing at least one of them, having good electrical conductivity. The metal plate is made of metal, such as copper, aluminum, or an alloy containing at least one of them, having high thermal conductivity.

The semiconductor chips are power devices made of silicon, silicon carbide, or gallium nitride. As stated above, the semiconductor chips are RC-IGBTs. With the RC-IGBT, an IGBT, which is a switching element, and a free wheeling diode (FWD), which is a diode element, are formed in one chip. For example, such a semiconductor chip has a collector electrode (positive-electrode electrode) and an anode electrode as main electrodes on the back surface and has a gate electrode as a control electrode and an emitter electrode (negative-electrode electrode) and a cathode electrode as main electrodes on the front surface. Alternatively, a switching element and a diode element may be formed in different chips. In this case, the switching element is a power MOSFET or an IGBT. For example, such a semiconductor chip has a drain electrode (positive-electrode electrode, a collector electrode in the case of an IGBT) as a main electrode on the back surface and has a gate electrode as a control electrode and a source electrode (negative-electrode electrode, an emitter electrode in the case of an IGBT) as a main electrode on the front surface. Furthermore, the diode element is an FWD such as a Schottky barrier diode (SBD) or a P-intrinsic-N (PIN) diode. Such a semiconductor chip has a cathode electrode as a main electrode on the back surface and has an anode electrode as a main electrode on the front surface. The back surface of each semiconductor chip is bonded to a determined circuit pattern with a bonding member. The bonding member is solder or a sintered body. The solder is Pb-free solder which contains a determined alloy as a main ingredient. In addition, a sintered material used in the case of performing bonding by sintering is, for example, silver, iron, copper, aluminum, titanium, nickel, tungsten, or molybdenum powder.

Each lead frame connects a semiconductor chip and a circuit pattern of the insulated circuit board to form a determined circuit. The lead frames are made of metal, such as copper or a copper alloy, having good electrical conductivity. With the semiconductor device 1, an equivalent circuit, which is a three-phase inverter circuit, is realized by these semiconductor units.

The radiation plate has the shape of a flat plate and is rectangular in plan view. Furthermore, the radiation plate may cover the housing portions 12*a*, 12*b*, and 12*c* of the case 10 in plan view from the back surface of the case 10. The radiation plate is made of metal, such as aluminum, iron, silver, copper, or an alloy containing at least one of them, having high thermal conductivity. Such an alloy may be a composite metal material such as aluminum-silicon carbide (Al—SiC) or magnesium-silicon carbide (Mg—SiC).

Furthermore, a cooling unit (not illustrated) may be fixed to the back surface of the case 10 to which the radiation plate is fixed. For example, this cooling unit is made of metal, such as aluminum, iron, silver, copper, or an alloy containing at least one of them, having high thermal conductivity. In addition, the cooling unit is a heat sink including one or more fins, a water-cooling jacket, or the like. Moreover, the radiation plate may be integrated with the cooling unit.

With the semiconductor device 1, the second power terminal 22 is electrically connected to a collector electrode of an upper arm semiconductor chip of a semiconductor unit in each of the housing portions 12*a*, 12*b*, and 12*c*. The U-phase output terminal 23, the V-phase output terminal 24, or the W-phase output terminal 25 is electrically connected to an emitter electrode of an upper arm semiconductor chip and a collector electrode of a lower arm semiconductor chip of a semiconductor unit in each of the housing portions 12*a*, 12*b*, and 12*c*. Furthermore, the first power terminal 21 is electrically connected to an emitter electrode of a lower arm semiconductor chip of a semiconductor unit in each of the housing portions 12*a*, 12*b*, and 12*c*. As a result, the semiconductor device 1 functions as an inverter.

Figure 5:
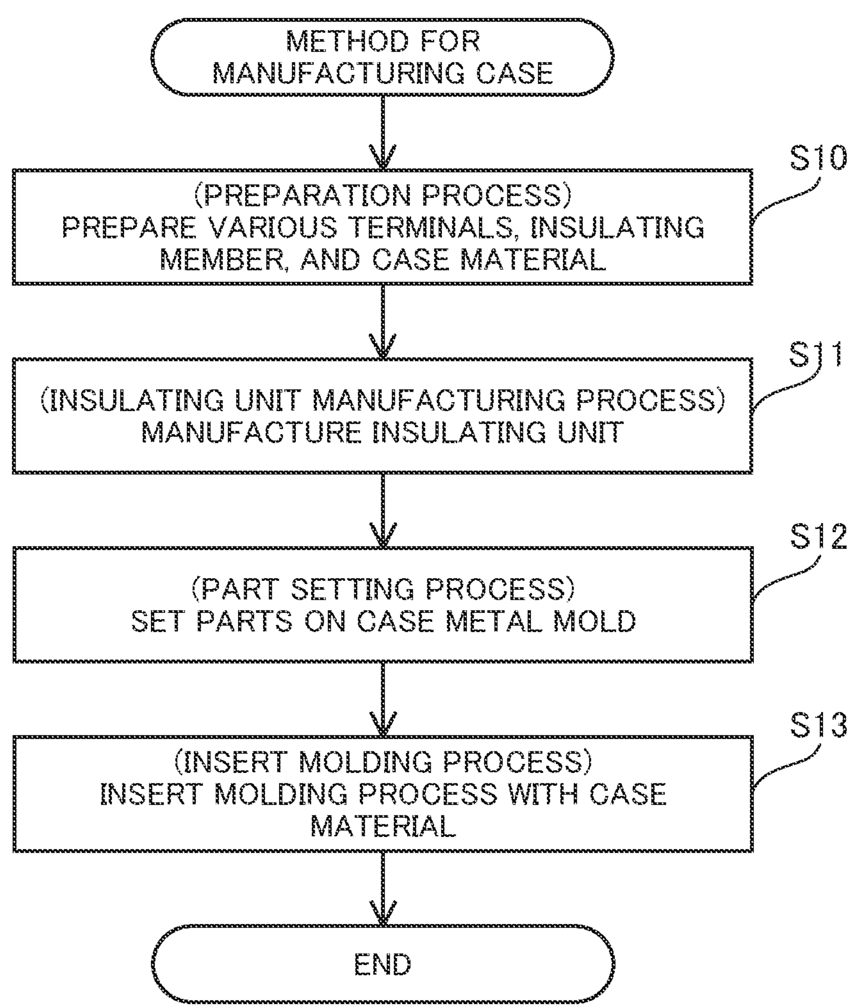
FIG. 5 is a flow chart of a method for manufacturing a case of the semiconductor device according to the first embodiment.

A method for manufacturing the case 10 included in the above semiconductor device 1 will now be described with reference to FIG. 5 and FIG. 4. FIG. 5 is a flow chart of a method for manufacturing the case of the semiconductor device according to the first embodiment. The method for manufacturing the case 10 is included in a method for manufacturing the semiconductor device 1.

To manufacture the case 10, first, a preparation process for preparing various terminals, an insulating member in sheet form, and a material for the case 10 (frame portion 11) is performed (step S10). Furthermore, materials, tools, parts, and the like needed for manufacturing the case are prepared at need in step S10. The various terminals are the first power terminal 21, the second power terminal 22, the U-phase output terminal 23, the V-phase output terminal 24, the W-phase output terminal 25, and the control terminals. The insulating member is, for example, aramid paper. The material for the case 10 is, for example, PPS resin.

Figure 6A:
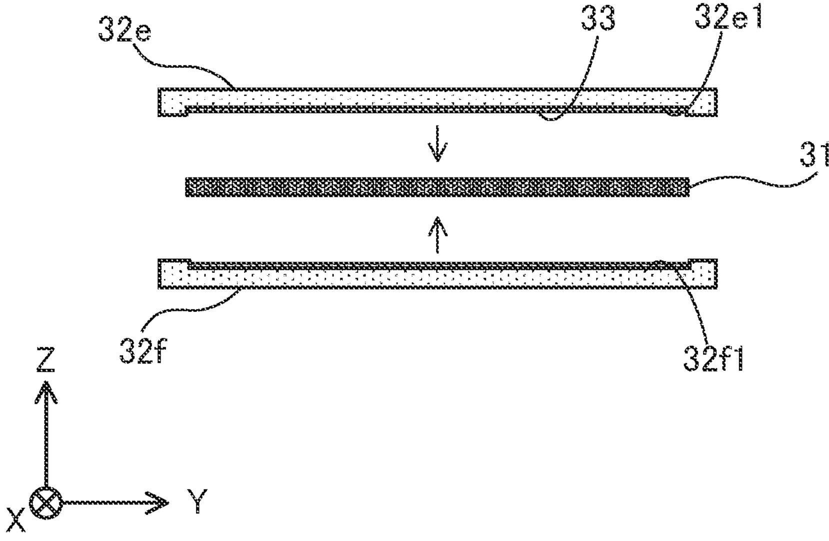
FIGS. 6A and 6B illustrate an insulating unit manufacturing process included in the method for manufacturing the case of the semiconductor device according to the first embodiment (part 1)
Figure 6B:
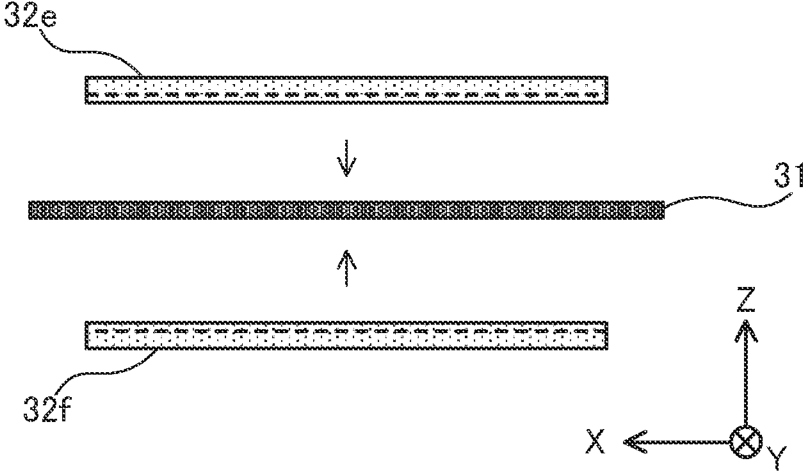
Figure 7A:
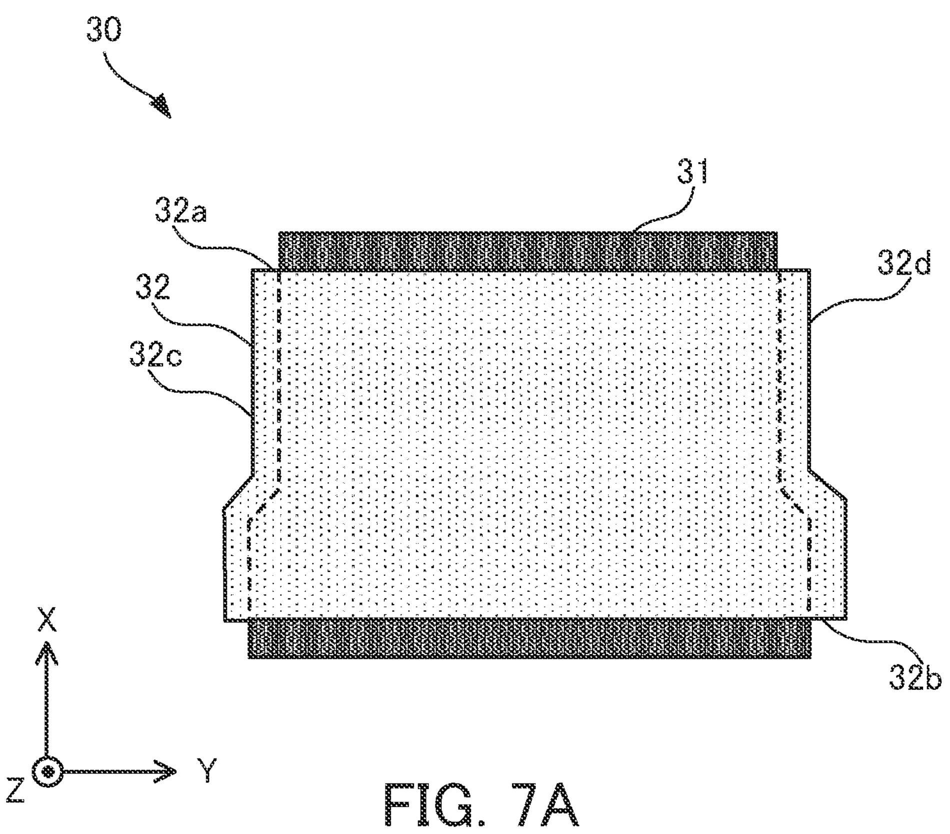
FIGS. 7A and 7B illustrate an insulating unit just after the insulating unit manufacturing process included in the method for manufacturing the case of the semiconductor device according to the first embodiment.
Figure 7B:
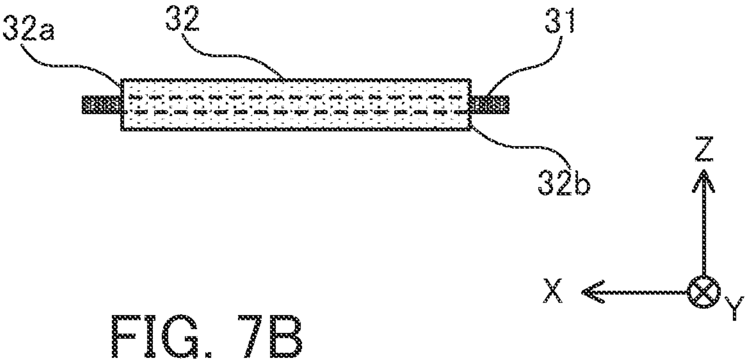

Next, an insulating unit manufacturing process for manufacturing the insulating unit 30 is performed (step S11). The insulating unit 30 illustrated in FIG. 4 is manufactured by several methods. An example of manufacturing methods will now be described with reference to FIGS. 6A and 6B and FIGS. 7A and 7B. FIGS. 6A and 6B illustrate an insulating unit manufacturing process included in the method for manufacturing the case of the semiconductor device according to the first embodiment. FIGS. 7A and 7B illustrate an insulating unit just after the insulating unit manufacturing process included in the method for manufacturing the case of the semiconductor device according to the first embodiment. FIG. 6A is a side view obtained in the insulating unit manufacturing process when fixing a sealing upper surface portion 32*e* and a sealing lower surface portion 32*f* included in the sealing portion 32 to the insulating paper 31 is viewed from the +X direction. Similarly, FIG. 6B is a side view obtained when fixing the sealing upper surface portion 32*e* and the sealing lower surface portion 32*f* to the insulating paper 31 is viewed from the +Y direction. FIG. 7A is a plan view illustrative of a state just after the sealing portion 32 is fixed to the insulating paper 31. FIG. 7B is a side view illustrative of the state just after the sealing portion 32 is fixed to the insulating paper 31.

First, the insulating paper 31 illustrated in FIG. 4 is obtained from the insulating member in sheet form. In this case, the insulating paper 31 is punched or cut from a piece of insulating paper. Next, the sealing portion 32 is formed in advance. The sealing portion 32 includes the sealing upper surface portion 32*e* and the sealing lower surface portion 32*f* divided in parallel with a principal plane (X-Y plane) (see FIGS. 6A and 6B). In this case, the sealing portion 32 is made of PPS resin. Accordingly, concavities 32*e*1 and 32*f*1 corresponding to the shape of the insulating paper 31 are formed in surfaces, which are opposite each other, of the sealing upper surface portion 32*e* and the sealing lower surface portion 32*f* respectively.

Next, the insulating paper 31 is put between the sealing upper surface portion 32*e* and the sealing lower surface portion 32*f*. As illustrated in FIGS. 6A and 6B, at this time, an adhesive member 33 is applied in advance to the concavities 32*e*1 and 32*f*1 of the sealing upper surface portion 32*e* and the sealing lower surface portion 32*f* respectively. By putting the insulating paper 31 between the sealing upper surface portion 32*e* and the sealing lower surface portion 32*f*, the insulating unit 30 illustrated in FIGS. 7A and 7B is manufactured. With the insulating unit illustrated in FIGS. 7A and 7B, the insulating paper 31 protrudes from a front end surface 32*a* and a back end surface 32*b* of the sealing portion 32. Portions of the insulating paper 31 protruding from the front end surface 32*a* and the back end surface 32*b* are cut at need. By doing so, the insulating unit 30 illustrated in FIG. 4 is obtained.

A case where the sealing upper surface portion 32*e* and the sealing lower surface portion 32*f* cover both side portions of the insulating paper 31 and do not cover the front section 31*a* or the back section 31*b* of the insulating paper 31 is taken as an example. The sealing upper surface portion 32*e* and the sealing lower surface portion 32*f* may be manufactured so as to cover the entire insulating paper 31. Furthermore, the entire insulating paper 31 need not be covered. At least one principal plane of the insulating paper 31 need only be covered with the sealing portion 32. Accordingly, only one of the sealing upper surface portion 32*e* and the sealing lower surface portion 32*f* may be fixed to the insulating paper 31. In addition, in this case, the side portions of the insulating paper 31 need not be covered.

Figures 8A, 8B:
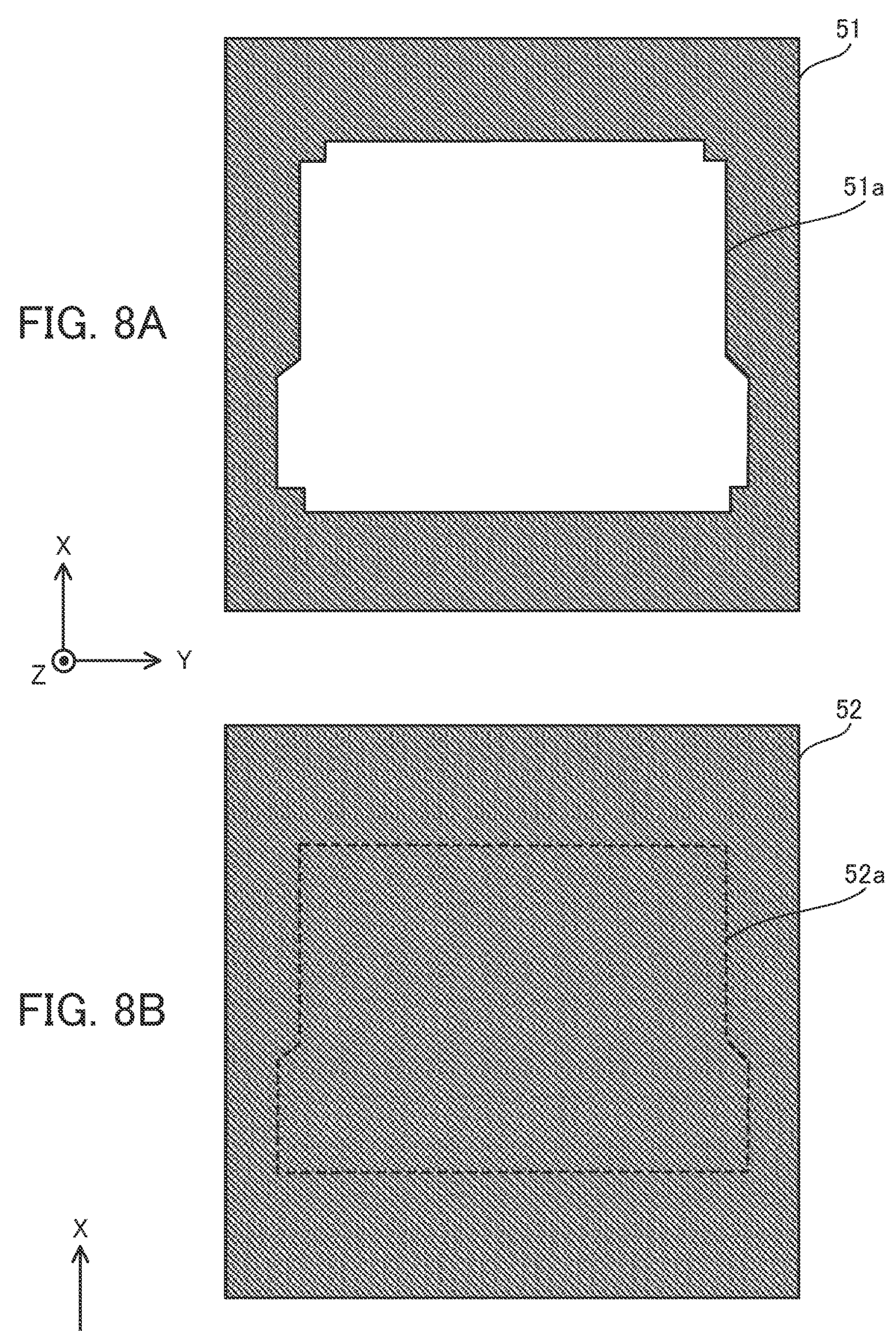
FIGS. 8A and 8B illustrate an insulating unit metal mold used in the method for manufacturing the case of the semiconductor device according to the first embodiment.
Figure 9A:
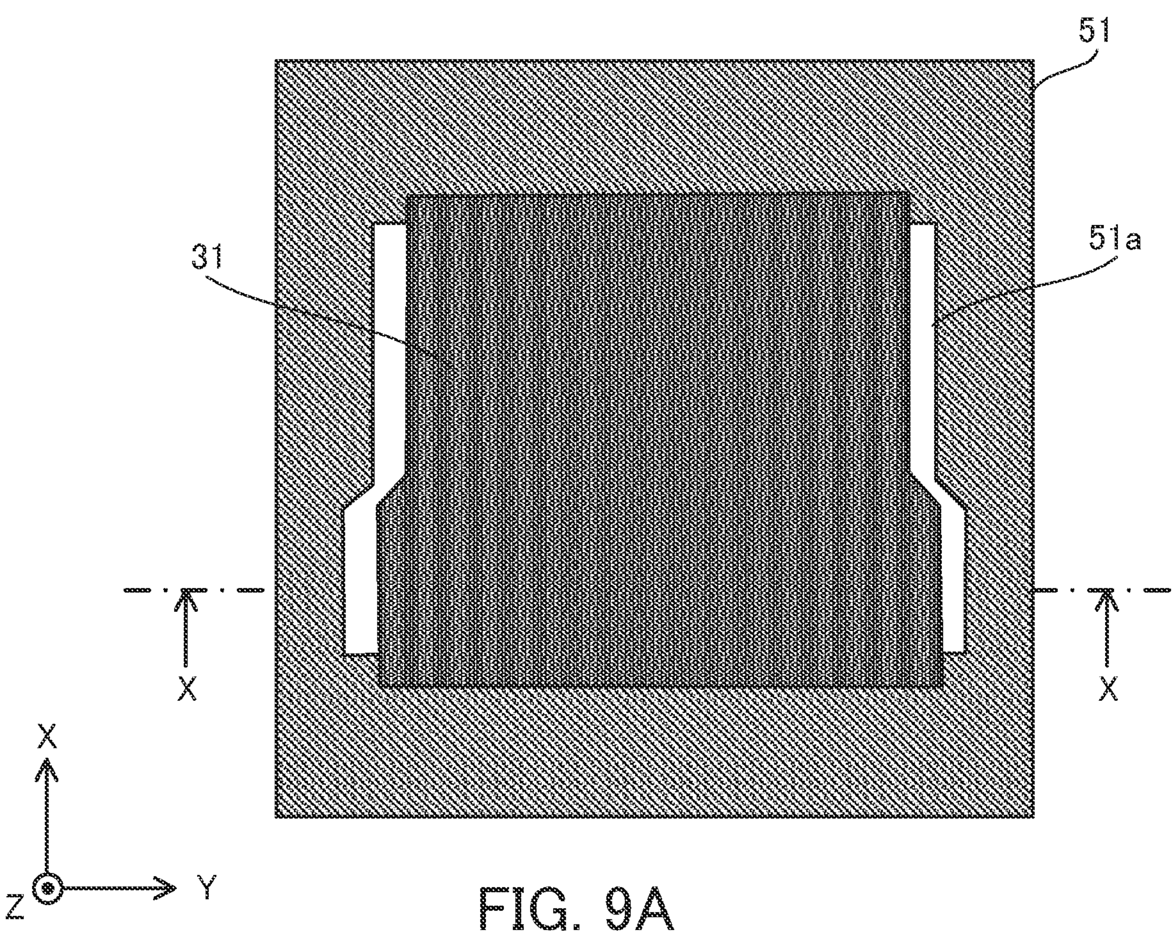
FIGS. 9A and 9B illustrate an insulating unit manufacturing process included in the method for manufacturing the case of the semiconductor device according to the first embodiment (part 2)
Figure 9B:
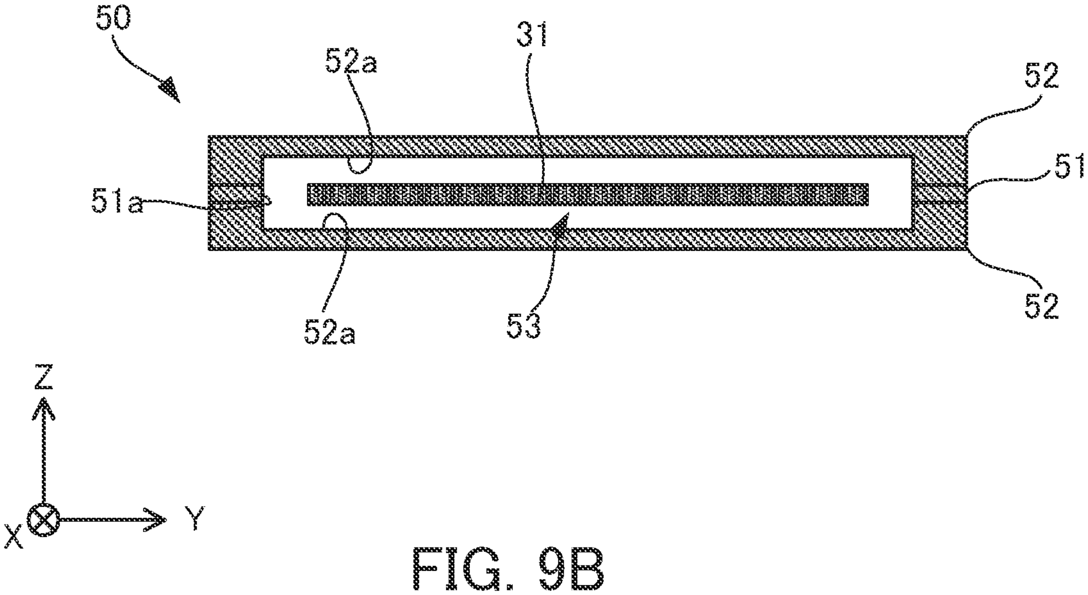

Furthermore, another example of a method for manufacturing the insulating unit 30 illustrated in FIG. 4 will be described with reference to FIGS. 8A and 8B, FIGS. 9A and 9B, and FIGS. 7A and 7B. FIGS. 8A and 8B illustrate an insulating unit metal mold used in the method for manufacturing the case of the semiconductor device according to the first embodiment. FIGS. 9A and 9B illustrate an insulating unit manufacturing process included in the method for manufacturing the case of the semiconductor device according to the first embodiment. FIG. 8A is a plan view of an insulating paper housing portion 51 of an insulating unit metal mold 50. FIG. 8B is a plan view of a sealing housing portion 52 of the insulating unit metal mold 50. FIG. 9A is a plan view of the insulating paper housing portion 51 of the insulating unit metal mold 50 on which the insulating paper 31 is set. FIG. 9B is a sectional view (corresponding to the dot-dash line X-X of FIG. 9A) of the insulating unit metal mold 50 on which the insulating paper 31 is set.

The insulating unit 30 is manufactured by injection molding. The insulating unit metal mold 50 used at this time includes the insulating paper housing portion 51 and a pair of sealing housing portions 52 between which the insulating paper housing portion 51 is put. The insulating paper housing portion 51 has the shape of a flat plate. As illustrated in FIG. 8A, an insulating paper opening portion 51*a* is formed. The shape of the insulating paper opening portion 51*a* corresponds to the external shape of the insulating paper 31. Each sealing housing portion 52 also has the shape of a flat plate. As illustrated in FIG. 8B, a concave sealing filling portion 52*a* is formed. The insulating unit metal mold 50 has heat resistance and is made of a material, such as carbon, having a low thermal expansion coefficient. As illustrated in FIG. 9A, first, the insulating paper 31 is fixed to the insulating paper opening portion 51*a* of the insulating paper housing portion 51 of the insulating unit metal mold 50.

Next, as illustrated in FIG. 9B, the sealing housing portions 52 are fixed to the front surface and the back surface of the insulating paper housing portion 51 to which the insulating paper 31 is fixed. At this time, a sealing filling portion 52*a* of each sealing housing portion 52 is opposed to the insulating paper housing portion 51. As a result, the insulating paper 31 fixed to the insulating paper housing portion 51 is housed in a cavity 53 formed by the sealing filling portions 52*a*. The cavity 53 of the insulating unit metal mold 50 including the insulating paper 31 is filled with a material for the insulating unit 30 and the material for the insulating unit 30 is solidified. The material for the insulating unit 30 is, for example, PPS resin. As a result, the insulating unit 30 illustrated in FIGS. 7A and 7B is manufactured. In this case, portions of the insulating paper 31 protruding are also cut at need. By doing so, the insulating unit 30 illustrated in FIG. 4 is obtained.

A setting process for setting parts on a case metal mold is performed (step S12) after step S11. The parts set at this time are the first power terminal 21, the insulating unit 30, the second power terminal 22, the U-phase output terminal 23, the V-phase output terminal 24, the W-phase output terminal 25, and the control terminals. Furthermore, when the parts are set, the second power terminal 22, the insulating unit 30, and the first power terminal 21 are laminated. Next, an insert molding process for filling the case metal mold with a material for the case (step S13). The material for the case 10 is, for example, PPS resin. In particular, the material for the insulating unit 30 set at this time on the case metal mold and the material for the case 10 are the same resin. Accordingly, the insulating unit 30 reliably adheres to the frame portion 11 (see, for example, FIG. 3). As a result, the insulating unit 30 is reliably fixed to the frame portion 11 without positional deviation. The case 10 illustrated in FIG. 1 and FIG. 2 is obtained in this way.

The case 10 manufactured in this way is set over the radiation plate to which the semiconductor units are bonded. At this time, the semiconductor units are housed in the housing portions 12*a*, 12*b*, and 12*c* of the case 10. A wiring process for electrically connecting the semiconductor units and various terminals of the case 10 is performed and the inside of the housing portions 12*a*, 12*b*, and 12*c* is filled with a sealing member. By doing so, the semiconductor device 1 is obtained.

The above semiconductor device 1 has the first power terminal 21 including the first bonding area 21*a*, the second power terminal 22 including the second bonding area 22*a*, the insulating unit 30 which exposes the first bonding area 21*a* and the second bonding area 22*a*, which is located between the first power terminal 21 and the second power terminal 22, and which has the shape of a flat plate, and the case 10 which exposes the first bonding area 21*a* and the second bonding area 22*a*, which includes the first power terminal 21 and the second power terminal 22, and to which the insulating unit 30 is bonded. The insulating unit 30 includes the insulating paper 31 in sheet form and the sealing portion 32 which covers at least one of the upper surface and the lower surface of the insulating paper 31. Accordingly, the insulating unit 30 keeps insulation between the first power terminal 21 and the second power terminal 22. Because an increase in the thickness of the insulating unit 30 is suppressed, an increase in the size of the semiconductor device 1 is suppressed. Furthermore, because the insulating unit 30 includes the insulating paper 31, it is possible to enhance the insulating property while suppressing an increase in the thickness of the insulating unit 30. In addition, unlike a case where only the insulating paper 31 is used, the strength of the insulating unit 30 is high and there is no possibility of a bend of the insulating unit 30. The sealing portion 32 outside the insulating paper 31 is made of the same resin that is used for forming the case 10. As a result, the insulating unit adheres to the case 10 and positional deviation is prevented.

The thickness of the insulating unit 30 will be described. A dielectric breakdown withstand voltage per unit thickness of the insulating paper 31 is 31 kV/mm and a dielectric breakdown withstand voltage per unit thickness of the sealing portion 32 (PPS resin) is 13 kV/mm. Accordingly, a dielectric breakdown withstand voltage per unit thickness of the insulating unit 30 is obtained by adding them and is 44 kV/mm. In order to maintain the reliability of the semiconductor device 1, 15 kV or more is needed as a dielectric breakdown withstand voltage of the insulating unit 30. Accordingly, considering that a dielectric breakdown withstand voltage per unit thickness of the insulating unit 30 is 44 kV/mm and that 15 kV or more is needed as a dielectric breakdown withstand voltage of the insulating unit 30, at least 0.8 mm is needed as the thickness of the insulating unit 30.

Furthermore, on the basis of the above, the thickness of the insulating paper 31 and the sealing portion 32 of the insulating unit 30 is set in the following way. For example, when 7.75 kV or more is needed as a dielectric breakdown withstand voltage of the insulating paper 31 and a dielectric breakdown withstand voltage of the sealing portion 32, then 0.25 mm or more is needed as the thickness of the insulating paper 31 and 0.55 mm or less is needed as the thickness of the sealing portion 32.

Furthermore, when the thickness of the insulating paper 31 is 0.35 mm, then a dielectric breakdown withstand voltage of the insulating paper 31 is about 10.85 kV. At this time, 4.16 kV or more is needed as a dielectric breakdown withstand voltage of the sealing portion 32 and the thickness of the sealing portion 32 is 0.32 mm or more. Therefore, in this case, the thickness of the insulating unit 30 is 0.67 mm.

Second Embodiment

Figure 10:
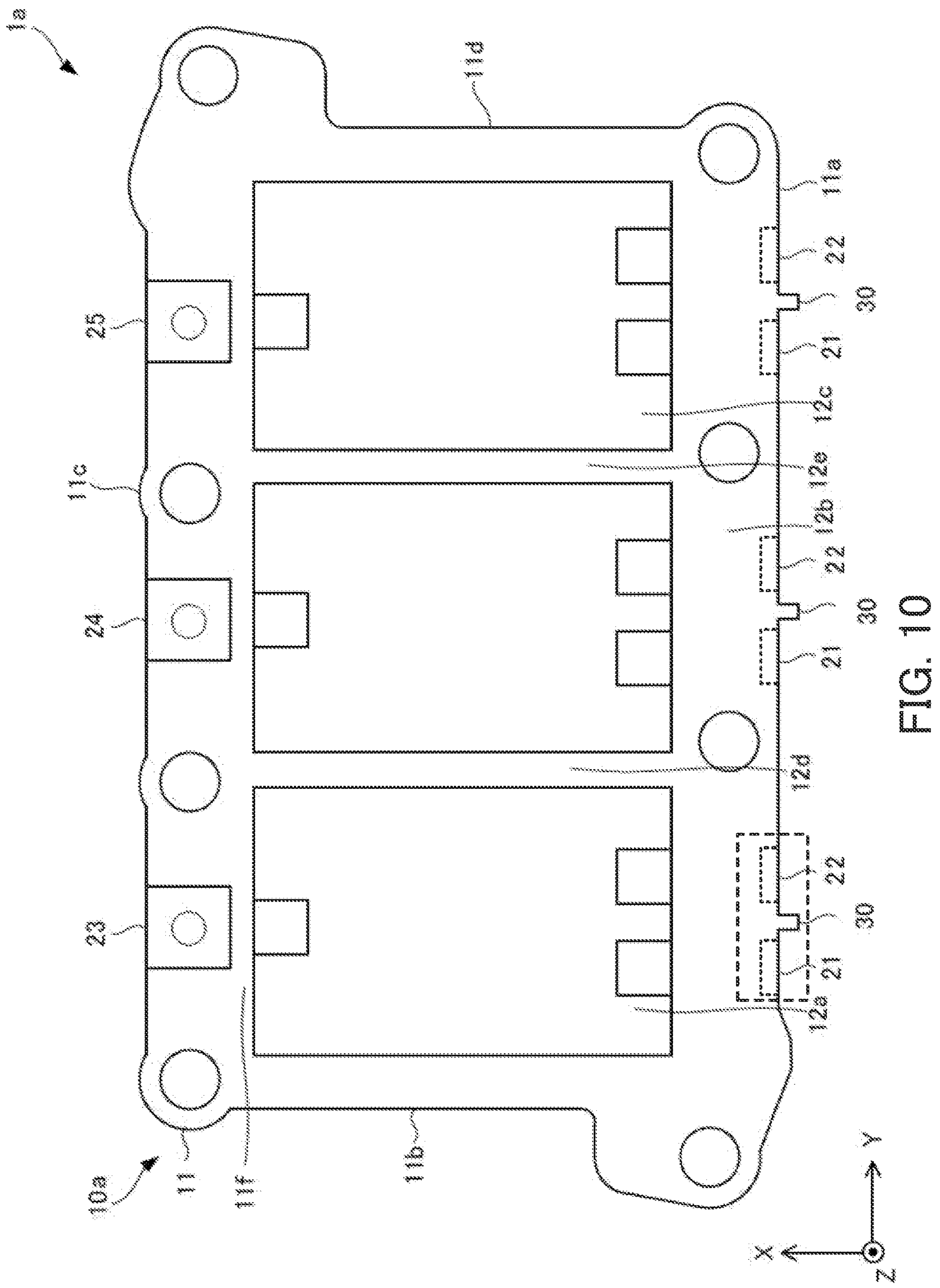
FIG. 10 is a plan view of a semiconductor device according to a second embodiment.

In the second embodiment, a case where a case different from that used in the first embodiment is used will be described with reference to FIG. 10. FIG. 10 is a plan view of a semiconductor device according to the second embodiment. A semiconductor device 1*a* also includes semiconductor units (not illustrated) and a case 10*a* which houses the semiconductor units. Furthermore, the semiconductor device 1*a* may include a radiation plate (not illustrated) over which the semiconductor units are located and which is located on the back surface of the case 10*a*. The case 10*a* includes a frame portion 11, terminal portions 20, a U-phase output terminal 23, a V-phase output terminal 24, a W-phase output terminal 25, and control terminals (not illustrated). The frame portion 11 is approximately rectangular in plan view and is surrounded on all sides by a first side portion 11*a* through a fourth side portion 11*d*. The frame portion 11 includes housing portions 12*a*, 12*b*, and 12*c* along the first side portion 11*a*. The frame portion 11 of the case 10*a* is integrally molded with a first power terminal 21, a second power terminal 22, the U-phase output terminal 23, the V-phase output terminal 24, the W-phase output terminal 25, and the control terminals (not illustrated). This is the same with the first embodiment. The first power terminal 21 is made of the same material that is used for forming the first power terminal 21 in the first embodiment. The same applies to the second power terminal 22, the U-phase output terminal 23, the V-phase output terminal 24, and the W-phase output terminal 25, and the control terminals.

The second power terminal 22 and the first power terminal 21 between which an insulating unit 30 is located make a pair and a plurality of pairs are arranged along the first side portion 11*a* of the frame portion 11. These will be described later.

The inside of the frame portion 11 of the case 10 is partitioned in plan view into the housing portions 12*a*, 12*b*, and 12*c* with partition portions 12*d* and 12*e*. The housing portions 12*a*, 12*b*, and 12*c* are located in the longitudinal direction of the frame portion 11 (along the first side portion 11*a* and the third side portion 11*c*). A semiconductor unit is housed in each of the housing portions 12*a*, 12*b*, and 12*c*. The semiconductor unit is electrically connected to the other end portions (first connecting portion 21*e* and a second connecting portion 22*e* described later) of the first power terminal 21 and the second power terminal 22 in each of the housing portions 12*a*, 12*b*, and 12*c*. Furthermore, the semiconductor unit is electrically connected to the U-phase output terminal 23, the V-phase output terminal 24, and the W-phase output terminal 25 in each of the housing portions 12*a*, 12*b*, and 12*c*. For example, one end portions of the control terminals may extend in the +Z direction from the partition portions 12*d* and 12*e*. The other end portions of the control terminals are electrically connected to gate electrodes (control electrodes) of semiconductor chips of the semiconductor units in the housing portions 12*a*, 12*b*, and 12*c*.

One end portions of the U-phase output terminal 23, the V-phase output terminal 24, and the W-phase output terminal 25 are exposed on the front surface of the third side portion 11*c* of the frame portion 11 in the longitudinal direction of the frame portion 11 (along the third side portion 11*c*). The other end portions of the U-phase output terminal 23, the V-phase output terminal 24, and the W-phase output terminal 25 are exposed in the housing portions 12*a*, 12*b*, and 12*c* respectively. The other end portions of the U-phase output terminal 23, the V-phase output terminal 24, and the W-phase output terminal 25 are electrically connected to source electrodes (or emitter electrodes) of the semiconductor chips of the semiconductor units.

Figure 11:
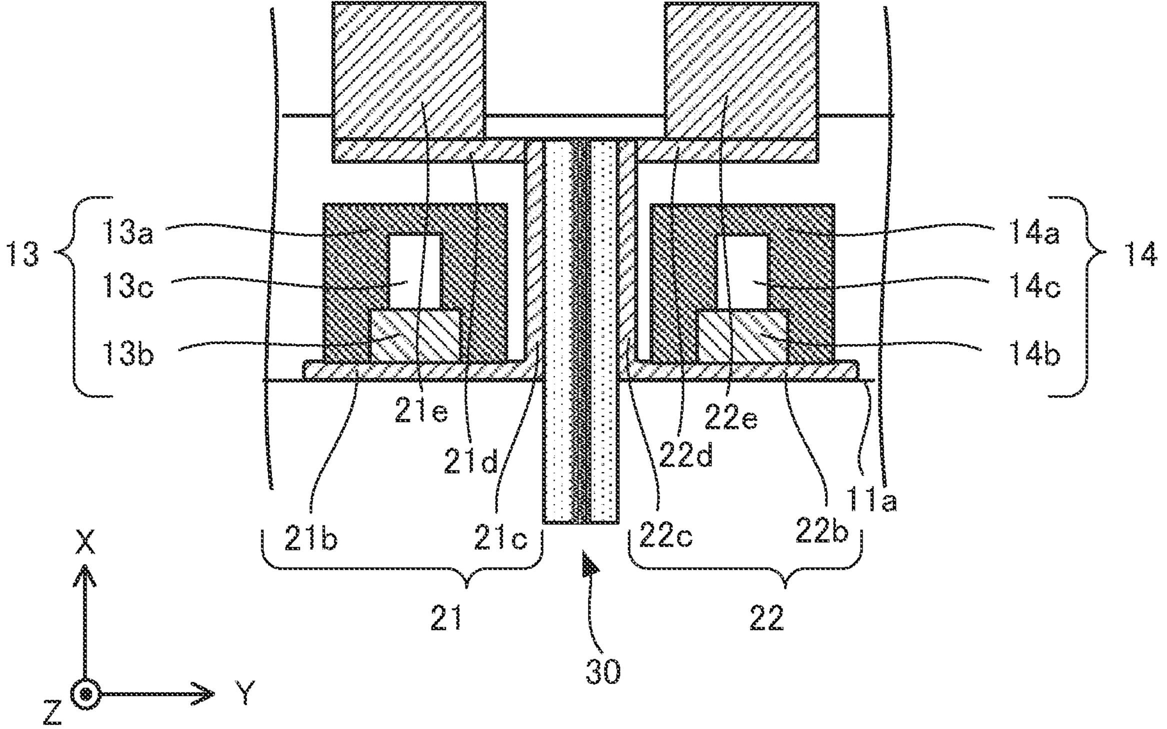
FIG. 11 is a fragmentary sectional view of the semiconductor device according to the second embodiment.
Figure 12A:
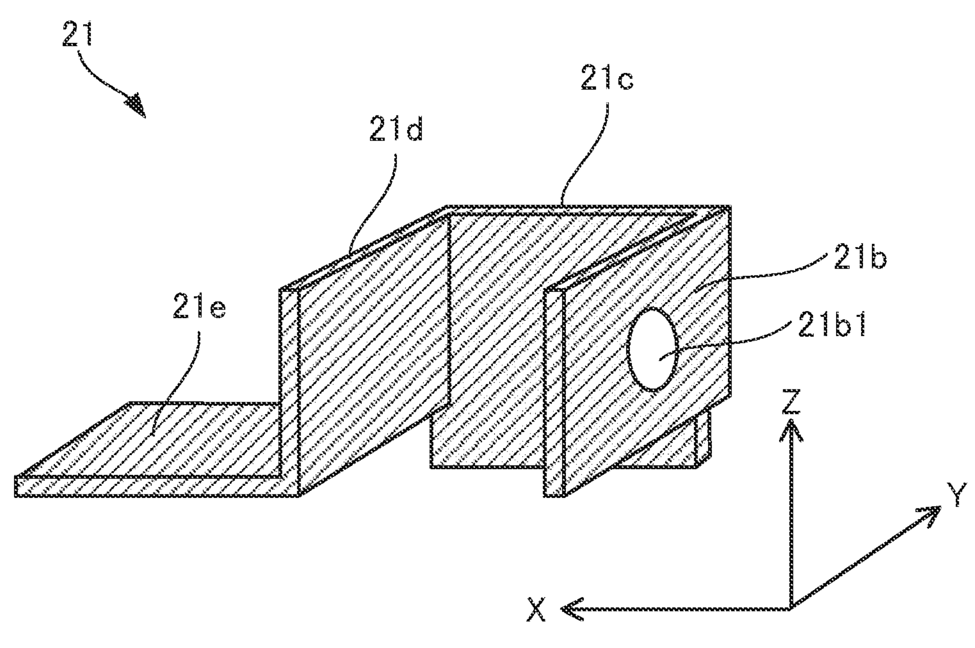
FIGS. 12A and 12B illustrate a first power terminal and a second power terminal, respectively, included in the semiconductor device according to the second embodiment.
Figure 12B:
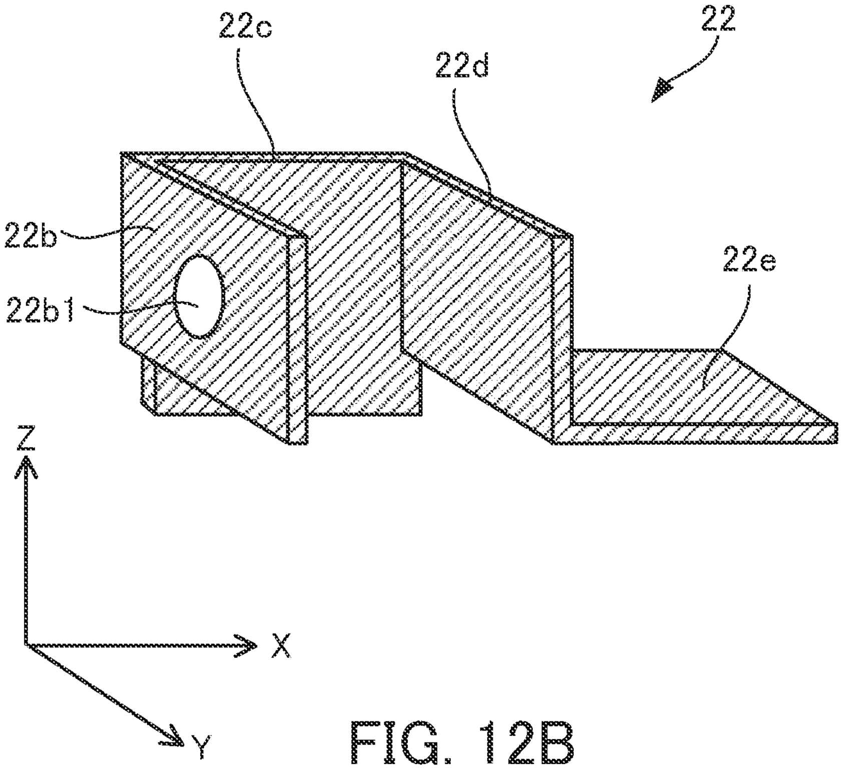

The second power terminal 22 and the first power terminal 21 between which the insulating unit 30 is put and which are located in the first side portion 11*a* of the frame portion 11 will now be described with reference to FIG. 11 and FIGS. 12A and 12B. FIG. 11 is a fragmentary sectional view of the semiconductor device according to the second embodiment. FIGS. 12A and 12B illustrate the first power terminal and the second power terminal, respectively, included in the semiconductor device according to the second embodiment. FIG. 11 is a sectional view of an area enclosed by the dashed line of FIG. 10 which is taken along the X-Y plane. FIG. 12A illustrates the first power terminal 21 and FIG. 12B illustrates the second power terminal 22.

The first power terminal 21 includes a first bonding portion 21*b*, a first wiring portion 21*c*, a first linking portion 21*d*, and a first connecting portion 21*e*. Each of the first bonding portion 21*b*, the first wiring portion 21*c*, the first linking portion 21*d*, and the first connecting portion 21*e* has the shape of a flat plate.

A first fastening hole 21*b*1 is made in the first bonding portion 21*b* and faces in the —X direction. That is to say, the first bonding portion 21*b* is parallel to the Z-Y plane. An N-type external terminal is connected from the outside to the first fastening hole 21*b*1 of the first bonding portion 21*b*.

The first wiring portion 21*c* is connected to the first bonding portion 21*b* perpendicularly thereto. That is to say, the first bonding portion 21*b* is formed so that it will bend from the first wiring portion 21*c*. The first wiring portion 21*c* is integrally connected to an end portion in the +Y direction of the first bonding portion 21*b* and extends to the inside of the first side portion 11*a* of the frame portion 11. That is to say, the first wiring portion 21*c* is parallel to the Z-X plane.

The first linking portion 21*d* is connected to the first wiring portion 21*c* perpendicularly thereto. That is to say, the first linking portion 21*d* bends from the first wiring portion 21*c* and is opposed to the first bonding portion 21*b*. The first linking portion 21*d* is integrally connected to an end portion in the +X direction of the first wiring portion 21*c* and extends. That is to say, the first linking portion 21*d* is parallel to the Z-Y plane. The first bonding portion 21*b*, the first wiring portion 21*c*, and the first linking portion 21*d* form the shape of the letter "U" in plan view.

The first connecting portion 21*e* is connected to the first linking portion 21*d* perpendicularly thereto. That is to say, the first connecting portion 21*e* bends from the first linking portion 21*d* and is also perpendicular to the first bonding portion 21*b* and the first wiring portion 21*c*. The first connecting portion 21*e* is integrally connected to an end portion in the —Z direction of the first linking portion 21*d* and extends to the inside of the first side portion 11*a* of the frame portion 11. That is to say, the first connecting portion 21*e* is parallel to the X-Y plane. The first connecting portion 21*e* is electrically connected to a main electrode of a semiconductor chip in the frame portion 11.

A nut cover 13 is located in an area surrounded by the first bonding portion 21*b*, the first wiring portion 21*c*, and the first linking portion 21*d* of the above first power terminal 21. With the nut cover 13, a nut 13*b* is integrally molded with a cover body 13*a*. Furthermore, the cover body 13*a* includes behind the nut 13*b* (on the side of the first linking portion 21*d*) a space (bolt housing portion 13*c*) which communicates with a hole in the nut 13*b*. The nut cover 13 is located so that the nut 13*b* will correspond to the first fastening hole 21*b*1 of the first bonding portion 21*b*. Therefore, a bolt inserted into the first fastening hole 21*b*1 of the first bonding portion 21*b* is fixed with the nut 13*b* and is housed in the bolt housing portion 13*c*. The nut 13*b* is integrally molded with the cover body 13*a* and the nut cover 13 is also manufactured in advance.

The second power terminal 22 also includes a second bonding portion 22*b*, a second wiring portion 22*c*, a second linking portion 22*d*, and a second connecting portion 22*e*. Each of the second bonding portion 22*b*, the second wiring portion 22*c*, the second linking portion 22*d*, and the second connecting portion 22*e* has the shape of a flat plate.

A second fastening hole 22*b*1 is made in the second bonding portion 22*b* and faces in the —X direction. That is to say, the second bonding portion 22*b* is parallel to the Z-Y plane. A P-type external terminal is connected from the outside to the second fastening hole 22*b*1 of the second bonding portion 22*b*.

The second wiring portion 22*c* is connected to the second bonding portion 22*b* perpendicularly thereto. That is to say, the second bonding portion 22*b* is formed so that it will bend from the second wiring portion 22*c* in the direction opposite to the first bonding portion 21*b*. The second wiring portion 22*c* is integrally connected to an end portion in the —Y direction of the second bonding portion 22*b* and extends to the inside of the first side portion 11*a* of the frame portion 11. That is to say, the second wiring portion 22*c* is parallel to the Z-X plane. Therefore, the second wiring portion 22*c* is opposed to the first wiring portion 21*c*.

The second linking portion 22*d* is connected to the second wiring portion 22*c* perpendicularly thereto. That is to say, the second linking portion 22*d* bends from the second wiring portion 22*c* and is opposed to the second bonding portion 22*b*. The second linking portion 22*d* is integrally connected to an end portion in the +X direction of the second wiring portion 22*c* and extends. That is to say, the second linking portion 22*d* is parallel to the Z-Y plane. The second bonding portion 22*b*, the second wiring portion 22*c*, and the second linking portion 22*d* form the shape of the letter "U" in plan view.

The second connecting portion 22*e* is connected to the second linking portion 22*d* perpendicularly thereto. That is to say, the second connecting portion 22*e* bends from the second linking portion 22*d* and is also perpendicular to the second bonding portion 22*b* and the second wiring portion 22*c*. The second connecting portion 22*e* is integrally connected to an end portion in the —Z direction of the second linking portion 22*d* and extends to the inside of the first side portion 11*a* of the frame portion 11. That is to say, the second connecting portion 22*e* is parallel to the X-Y plane. The second connecting portion 22*e* is electrically connected to a main electrode of a semiconductor chip in the frame portion 11.

A nut cover 14 is located in an area surrounded by the second bonding portion 22*b*, the second wiring portion 22*c*, and the second linking portion 22*d* of the above second power terminal 22. With the nut cover 14, a nut 14*b* is integrally molded with a cover body 14*a*. Furthermore, the cover body 14*a* includes behind the nut 14*b* (on the side of the second linking portion 22*d*) a space (bolt housing portion 14*c*) which communicates with a hole in the nut 14*b*. The nut cover 14 is located so that the nut 14*b* will correspond to the second fastening hole 22*b*1 of the second bonding portion 22*b*. Therefore, a bolt inserted into the second fastening hole 22*b*1 of the second bonding portion 22*b* is fixed with the nut 14*b* and is housed in the bolt housing portion 14*c*. The nut 14*b* is integrally molded with the cover body 14*a* and the nut cover 14 is also manufactured in advance.

The structure of the insulating unit 30 is the same as that of the insulating 30 in the first embodiment. However, the insulating unit 30 in this embodiment is rectangular in plan view and includes areas which are in contact with the first wiring portion 21*c* and the second wiring portion 22*c*. The insulating unit 30 is put between the first wiring portion 21*c* of the first power terminal 21 and the second wiring portion 22*c* of the second power terminal 22. The insulating unit 30 includes a portion protruding in the —X direction from the first bonding portion 21*b* and the second bonding portion 22*b*. A front section 31*a* and a back section 31*b* of the insulating unit 30 may face in the #X directions or the +Z directions.

The above case 10*a* and semiconductor device 1*a* are manufactured in the same way that is described in the flow chart of FIG. 5 in the first embodiment. In the second embodiment, the nut covers 13 and 14 are also molded in advance. In step S12, not only the first power terminal 21, the insulating unit 30, the second power terminal 22, the U-phase output terminal 23, the V-phase output terminal 24, the W-phase output terminal 25, and the control terminals but also the nut covers 13 and 14 are set in a case metal mold. In step S13, the case 10*a* including the nut covers 13 and 14 is molded. With the insulating unit 30 in the second embodiment manufactured in this way, it is also possible to keep insulation between the first power terminal 21 and the second power terminal 22 without increasing the thickness of the insulating unit 30. Because the insulating unit 30 includes an insulating paper 31, it is possible to enhance the insulating property while suppressing an increase in the thickness of the insulating unit 30. Furthermore, unlike a case where only the insulating paper 31 is used, the strength of the insulating unit 30 is high and there is no possibility of a bend of the insulating unit 30. A sealing portion 32 outside the insulating paper 31 is made of the same resin that is used for forming the frame portion 11 of the case 10*a*. As a result, the insulating unit 30 adheres to the frame portion 11 of the case 10*a* and positional deviation is prevented.

With the semiconductor device having the above structure, insulation between connection terminals is kept and an increase in size is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a case having
a first power terminal including a first bonding area, and
a second power terminal including a second bonding area; and
an insulating unit located between the first power terminal and the second power terminal, and having a shape of a flat plate, the insulating unit being bonded to the case, wherein
the insulating unit has
a first insulating portion in a sheet form, and
a second insulating portion which covers and directly contacts an upper surface,
a lower surface, or both the upper and lower surfaces, of the first insulating portion,
the first bonding area and the second bonding area are exposed from the insulating unit and from the case.

2. The semiconductor device according to claim 1, wherein:
the case is made of a first resin; and
the second insulating portion is made of a second resin.

3. The semiconductor device according to claim 2, wherein the first resin and the second resin are made of a same material.

4. The semiconductor device according to claim 2, wherein the first resin and the second resin are thermoplastic resins.

5. The semiconductor device according to claim 4, wherein the thermoplastic resins include polyphenylene sulfide (PPS) resins.

6. The semiconductor device according to claim 1, wherein
the first insulating portion has a plurality of first end surfaces,
the second insulating portion has a plurality of second end surfaces, and
at least one of the first end surfaces is exposed from at least one of the second end surfaces.

7. The semiconductor device according to claim 6, wherein at least one of the first end surfaces is flush with at least one of the second end surfaces.

8. The semiconductor device according to claim 1, wherein a thickness of the insulating unit is 0.8 mm.

9. The semiconductor device according to claim 8, wherein:
a thickness of the first insulating portion is greater than or equal to 0.25 mm; and
a thickness of the insulating unit other than the first insulating portion is smaller than or equal to 0.55 mm.

10. The semiconductor device according to claim 1, wherein the insulating unit has an insulating area that is a terrace portion between the first bonding area and the second bonding area, a surface of the insulating area being exposed.

11. The semiconductor device according to claim 1, wherein:
the first power terminal includes
a first wiring portion having a shape of a flat plate, and
a first bonding portion having the shape of the flat plate and being connected to the first wiring portion in a first direction, the first bonding area being on a front surface of the first bonding portion; and
the second power terminal includes
a second wiring portion in parallel to the first wiring portion and having the shape of the flat plate, and
a second bonding portion having the shape of the flat plate and being connected to the second wiring portion in a second direction opposite to the first direction, the second bonding area being on a front surface of the second bonding portion; and
the insulating unit is located between the first wiring portion and the second wiring portion.

12. The semiconductor device according to claim 11, wherein the insulating unit protrudes outward from between the first bonding portion and the second bonding portion.

13. A semiconductor device, comprising:
a case having
a first power terminal including a first bonding area, and
a second power terminal including a second bonding area; and
an insulating unit located between the first power terminal and the second power terminal, and having a shape of a flat plate, the insulating unit being bonded to the case, wherein
the insulating unit has
a first insulating portion in a sheet form, and
a second insulating portion which covers an upper surface, a lower surface, or both the upper and lower surfaces, of the first insulating portion,
the first bonding area and the second bonding area are exposed from the insulating unit and from the case, wherein
the first and the second insulting portions are made of different materials.

14. The semiconductor device according to claim 13, wherein the first insulting portion is made of aramid paper.

* * * * *